United States Patent
Park et al.

[11] Patent Number: 5,858,858
[45] Date of Patent: Jan. 12, 1999

[54] ANNEALING METHODS FOR FORMING ISOLATION TRENCHES

[75] Inventors: Tai-su Park; Moon-han Park, both of Kyungki-do; Yu-gyun Shin, Seoul; Han-sin Lee, Kyungki-do, all of Rep. of Korea

[73] Assignee: Samsung Electronics Co., Ltd., Kyungki-do, Rep. of Korea

[21] Appl. No.: 729,453

[22] Filed: Oct. 11, 1996

[30] Foreign Application Priority Data

May 21, 1996 [KR] Rep. of Korea ............ 96-17207

[51] Int. Cl.[6] .................................. H02L 21/76
[52] U.S. Cl. ............ 438/424; 438/437; 438/702; 438/692; 438/743
[58] Field of Search .................. 438/424, 435, 438/436, 438, 437, 227, 702, 692, 743

[56] References Cited

U.S. PATENT DOCUMENTS 5,091,330  2/1992  Cambou et al. .
5,445,989  8/1995  Lur et al. .
5,492,858  2/1996  Bose et al. .

OTHER PUBLICATIONS

Perera et al., *Trench Isolation For 0.45 μm Active Pitch and Below*, International Electron Devices Meeting, Washington, DC, Dec. 10–13, 1995 IEEE, IEDM 95, 28.1.1–28.1.4, pp. 679–682, 1995.

*Primary Examiner*—George R. Fourson
*Attorney, Agent, or Firm*—Myers Bigel Sibley & Sajovec

[57] ABSTRACT

A method for forming a microelectronic structure includes the steps of forming a mask layer on a substrate, forming a trench in the exposed portion of the substrate, forming a layer of an insulating material which fills the trench and covers the mask layer, and annealing the insulating material at a temperature of at least about 1,150° C. The annealing step can be performed for a period of time of about .5 hours to about 8 hours, and the annealing step can be performed in an inert atmosphere.

23 Claims, 4 Drawing Sheets

ANNEALING METHODS FOR FORMING ISOLATION TRENCHES

FIELD OF THE INVENTION

The present invention relates to the field of microelectronics and more particularly to isolation methods for microelectronic devices.

BACKGROUND OF THE INVENTION

Shallow trench isolation (STI) techniques have been developed to improve the local oxidation of silicon (LOCOS) process which is widely used in the manufacture of microelectronic devices. In a shallow trench isolation method, a semiconductor substrate is etched to form a shallow trench and insulating materials are buried in the trench to form an isolation layer. When using a conventional LOCOS process, the isolation layer is formed by thermal oxidation. When using a conventional STI method, thermal oxidation is not used. Accordingly, the use of the STI method reduces problems caused by thermal oxidation. For example, the bird's beak phenomenon which occurs at the boundary between the isolation region and an active region in a conventional LOCOS method can be reduced.

FIG. 1 is a cross-sectional view illustrating problems which may be associated with conventional trench isolation methods. The microelectronic structure of FIG. 1 includes a semiconductor substrate 100, and an oxide filling 200 in a trench region of the substrate which is formed by etching the substrate 100. The reference characters A and B respectively represent surface profiles of the oxide filling before and after a wet etch.

If the pad oxide and mask layers which are used to selectively form the trench are over etched during a wet etch, the upper sidewall of the trench region may be exposed as indicated by reference character C. Accordingly, when the gate insulating layer and the gate electrode of a MOS transistor are formed on the exposed sidewall of the trench region (the sidewall of an active region), a gate electric field may have a greater intensity at the edge of the channel than at the center of the channel. A parasitic channel may thus be formed at the sidewall of the active region even though a voltage lower than the threshold voltage is applied to the gate electrode. This parasitic channel may result in a hump phenomenon wherein the transistor turns on twice. In addition, the threshold voltage of the transistor may be reduced as the width of the channel region decreases resulting in an inverse narrow width effect.

When a shallow trench isolation method is used to provide isolation for highly integrated microelectronic device, the electrical characteristics of a MOS transistor formed thereon may depend on a profile of the edge of the trench. Accordingly, as the etch rate of the oxide 200 in the trench varies, the profile of the trench and oxide varies. As the profile varies so do the electrical characteristics of a MOS transistor formed adjacent thereto. Accordingly, because the etch rate of the oxide 200 is dependent on the densification process used, the characteristics of the MOS transistor are dependent on the densification process used. The process conditions used to densify the oxide 200 should thus be optimized.

A trench isolation method for CMOS device fabrication is discussed in the reference by Asanga H. Perea et al., entitled "Trench Isolation For 0.45 $\mu$cm Active Pitch And Below", IEDM Tech. Digest, p. 679–682, 1995. In this reference, an ozonated APCVD TEOS oxide is annealed at 1,000° C. to stabilize the deposited oxide film. The upper sidewall of the trench region, however, may still be exposed. Accordingly, there continues to exist a need in the art for improved shallow trench isolation methods.

SUMMARY OF THE INVENTION

It is therefore an object of the present invention to provide improved methods for forming isolation trenches.

It is another object of the present invention to provide methods for forming isolation trenches which can reduce the hump phenomenon in transistors formed thereby.

It is still another object of the present invention to provide methods for forming isolation trenches which can reduce the inverse narrow width effect in transistors formed thereby.

These and other objects are provided according to the present invention by methods for forming microelectronic structures including the steps of forming a mask layer on a substrate, forming a trench in an exposed portion of the substrate, forming a layer of an insulating material which fills the trench and covers the mask layer, and annealing the insulating material at a temperature of at least about 1,150° C. Annealing the insulating material at this temperature can provide sufficient densification of the insulating material so that the mask layer can be selectively removed without exposing portions of the trench sidewalls. Accordingly, this method can be used to produce transistors having a reduced hump phenomenon and a reduced inverse narrow width effect.

More particularly, the annealing step can be performed for a period of time of about 0.5 hours to about 8 hours, and the annealing step can be performed in an inert atmosphere. In addition, the method can include the step of planarizing the insulating materials so that the mask layer is exposed, and the remaining portion of the mask layer can be removed so that the substrate is exposed. The planarizing step can be performed by using a chemical-mechanical polish.

The step of forming the mask layer can include the steps of forming an oxide layer on the substrate and forming a nitride layer on the oxide layer. The oxide layer portion of this mask can serve as a stress buffer to protect the substrate. The step of forming the insulating material can include forming an oxide layer on the inner walls of the trench and on the mask layer, and depositing an insulating material on the oxide layer to fill the trench. This insulating material can be an oxide formed by chemical vapor deposition.

The methods of the present invention allow the fabrication of isolation trenches which can be used to form transistors having a reduced hump effect as well as a reduced narrow width effect. More particularly, the annealing step of the present invention can provide sufficient densification for the insulating material in the trench so that significant portions of the trench sidewall are not exposed.

DETAILED DESCRIPTION

Figure 1:
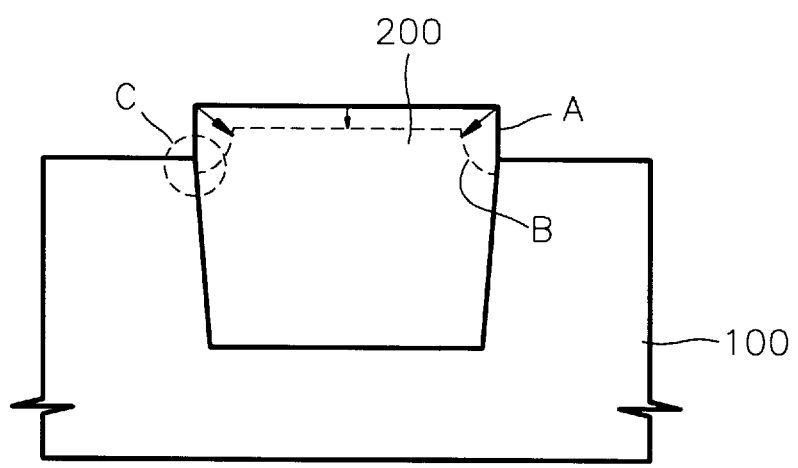
FIG. 1 is a cross-sectional view illustrating an isolation trench according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 2:
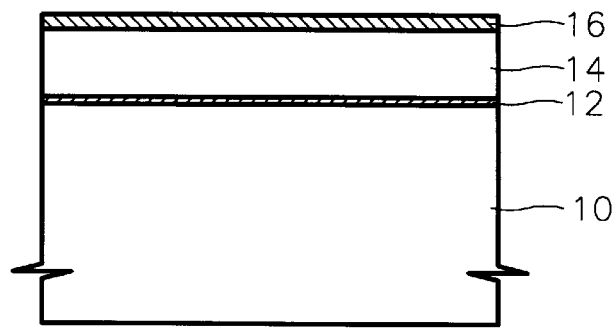
FIGS. 2–8 are cross-sectional views illustrating steps in a method for forming isolation trenches according to the present invention.

A method for forming an isolation trench according to the present invention will be described with reference to FIGS. 2–8. As shown in FIG. 2, a pad layer 12 is formed on the semiconductor substrate, and a mask layer 14 is formed on the pad layer. In addition, a buffer layer 16 is formed on the mask layer 14. The pad layer 12 which serves as a stress buffer can be formed from a thermal oxide on the order of 200 Ångstroms thick, and the mask layer 14 can be a layer of nitride. The buffer layer 16 can be formed from oxide and may serve as a buffer which reduces etching of the mask layer as will be discussed below.

Figure 3:
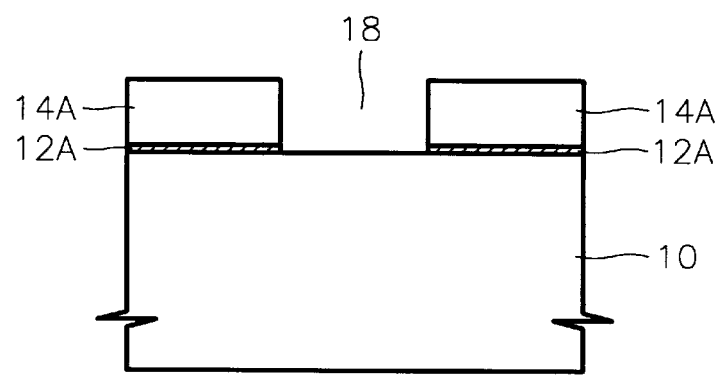
Figure 4:
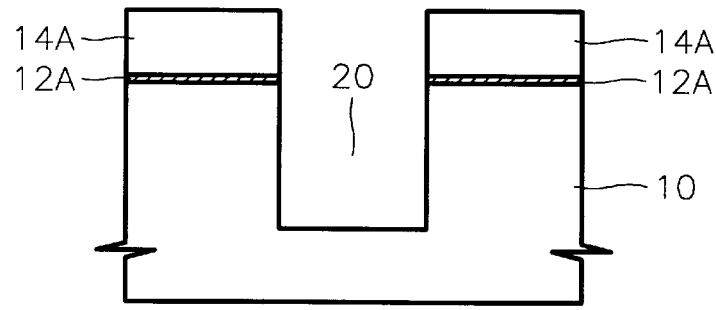
Figure 5:
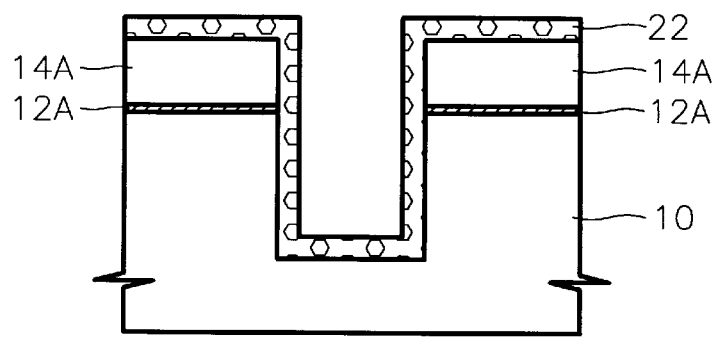

Isolation and active regions of a substrate are defined by selectively etching the mask layer 14 and pad layer 12 as shown in FIG. 3. In particular, a photoresist pattern can be formed on the buffer layer 16, and an anisotropic etch can be used to expose the isolation region 18 of the semiconductor substrate 10. The anisotropic etch removes exposed portions of the buffer layer 16, the mask layer 14, and the pad layer 12, and the photoresist layer and the remaining portions of the buffer layer 16 can then be removed. As shown in FIG. 3, the patterned mask layer 14A and the patterned pad layer 12A expose the isolation region 18.

The semiconductor substrate 10 is then anisotropically etched to a predetermined depth thereby forming the trench region 20. The patterned mask layer 14A serves as a mask during this etch. A thin oxide layer 22 is then grown on the inner walls of the trench region 20 and on the upper surface of the patterned mask layer 14A.

Figure 6:
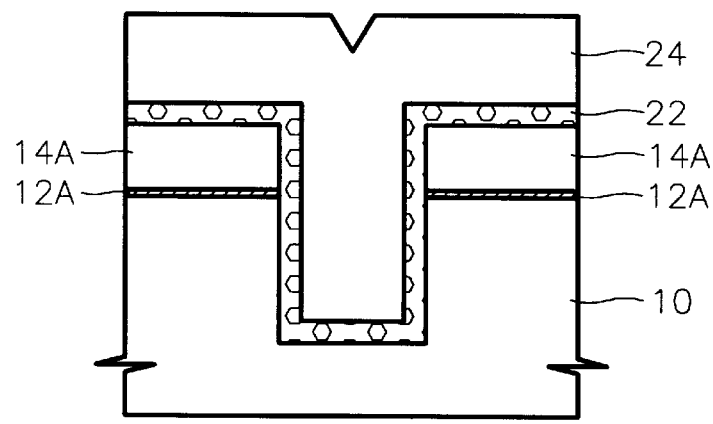

A layer of an insulating material 24 is deposited over the oxide layer 22 to a predetermined thickness sufficient to fill the trench region 20 and cover the surface of the oxide layer 22 as shown in FIG. 6. The insulating material making up the layer 24 is preferably an oxide formed by chemical vapor deposition. Preferably, the chemical vapor deposition technique used provides step coverage so that the layer 24 of the insulating material fills the trench. The layer 24 of the insulating material can then be annealed at 1,000° C.–1,400° C. for 0.5–8 hours to densify the insulating material. The step of annealing the insulating material is preferably performed in an atmosphere of an inert gas such as nitrogen ($N_2$) or argon (Ar) gas.

Figure 7:
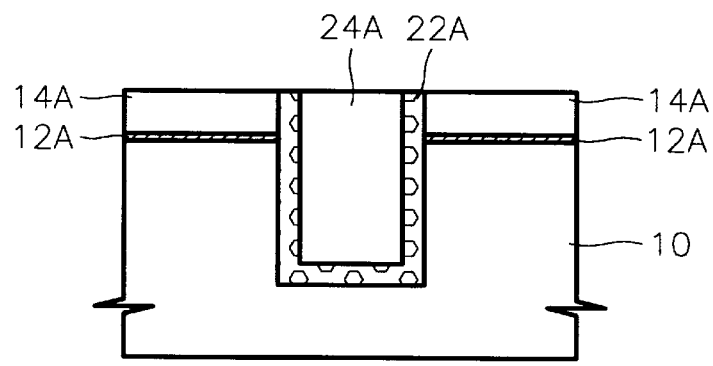
Figure 8:
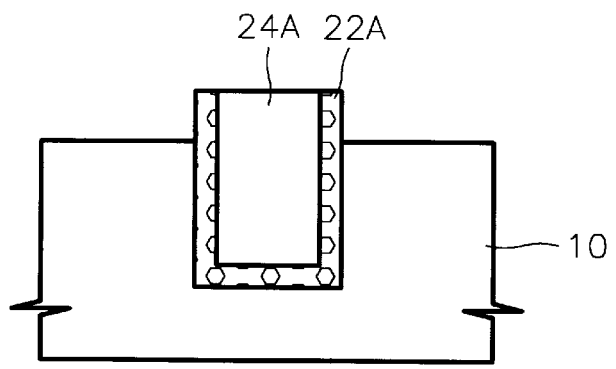

The layer 24 of the insulating material and the oxide layer 22 are then planarized until the patterned mask layer 14A is exposed as shown in FIG. 7. The remaining portion of the insulating material defines a buried oxide 24A, and the remaining portion of the thin oxide is labeled 22A. In particular, the planarizing step can be performed using a chemical-mechanical polishing (CMP) technique. Alternately, an etch back technique can be used to perform the planarization. The patterned mask layer 14A and the patterned pad layer 12A can then be removed by a wet etch. As shown in FIG. 8, the buried oxide 24A is not significantly damaged by the wet etch used to remove the patterned mask layer 14A and the patterned pad layer 12A.

Figure 9:
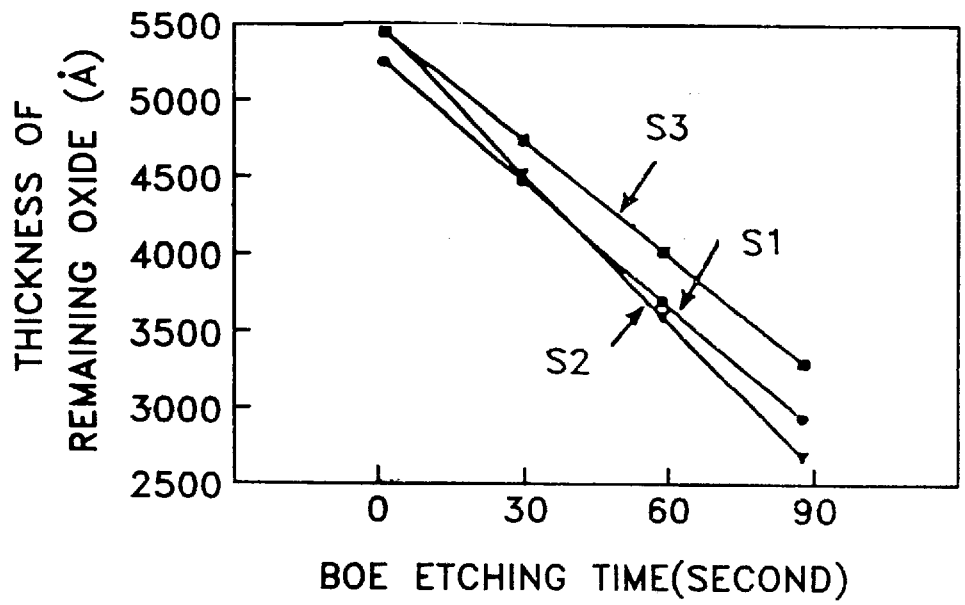
FIG. 9 is a graph showing the variation of the etching rate of a trench isolation oxide as a function of different densification processes.

FIG. 9 is a graph illustrating the change in thickness of the insulating material (oxide) as a function of the etching time when etching the insulating material using a buffered oxide etch. More particularly, each of the lines S1, S2, and S3 illustrates the thickness of different insulating materials per etching time wherein each of the insulating materials is annealed under different conditions. The insulating material represented by the line S1 was annealed at 850° C. for 30 minutes using $H_2O$ to provide a wet condition. The insulating material represented by the line S2 was annealed at 1,000° C. for one hour in a nitrogen ($N_2$) atmosphere. The insulating material represented by the line S3 was annealed at 1,150° C. for one hour in a nitrogen ($N_2$) atmosphere.

As shown, the etching rate for the insulating material represented by the line S3 was 1,400 Ångstroms per minute, the etching rate for the insulating material represented by the line S2 was 1,800 Ångstroms per minute, and the etching rate for the insulating material represented by the line S1 was 1,550 Ångstroms per minute. Accordingly, the etching rate for the insulating material represented by the line S3 was 400 Ångstroms per minute less than that of the insulating material represented by the line S2, and the etching rate of the insulating material represented by the line S3 was 150 Ångstroms per minute less than that of the insulating material represented by the line S1.

Figure 10:
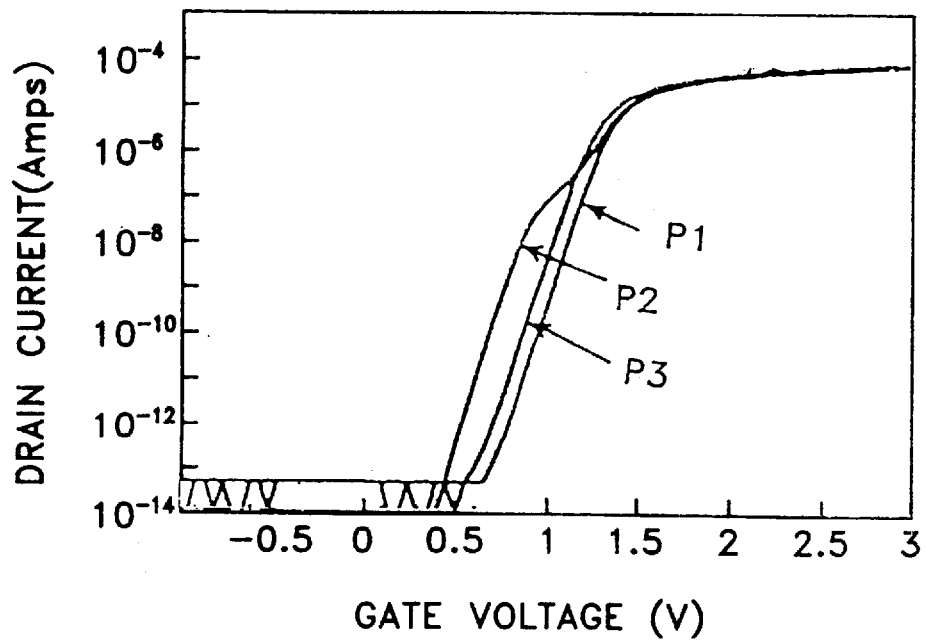
FIG. 10 is a graph showing the gate voltage ($V_g$) versus the drain current ($I_d$) for different transistors formed using different densification processes.

FIG. 10 is a graph illustrating the gate voltage ($V_g$) versus the drain current ($I_d$) for transistors formed using the insulating materials discussed above to fill the trench. In particular, the line P1 represents the voltage current characteristics for a transistor when the insulating material was annealed at 850° C. for 30 minutes using $H_2O$ to provide a wet condition. The line P2 represents the voltage current characteristics for a transistor formed using an insulating material annealed at 1,000° C. for one hour in a nitrogen ($N_2$) atmosphere. The line P3 represents the voltage current characteristics for a transistor using an insulating material annealed at 1,150° C. for one hour in a nitrogen ($N_2$) atmosphere.

As shown, the hump phenomenon does not occur in the transistors represented by lines P3 and P1, while the hump phenomenon does occur in the transistor represented by line P2. While the hump phenomenon does not occur in the transistor represented by the line P1, the volume of the oxide layer formed on the sidewall of the trench may expand when annealed as discussed above with regard to the transistor represented by the line P1. This expansion of the oxide layer may stress the sidewall of the silicon substrate possibly causing defects. Accordingly, the annealing step discussed above with regard to the transistor represented by the line P1 may be undesirable for the production of transistors.

The anneal used to densify the insulating material filling the trench is preferably performed at a higher temperature than previously performed in the prior art. The densification efficiency of the insulating material filling the trench can thus be improved. Accordingly, the etch rate of the insulating material filling the trench can be decreased for wet etches thereby reducing the hump phenomenon and the inverse narrow width effect of transistors formed thereby.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method for forming a microelectronic structure, said method comprising the steps of:

forming a mask layer on a substrate wherein said mask layer exposes a portion of said substrate;

forming a trench in said exposed portion of said substrate;

forming a layer of an insulating material which fills said trench and covers said mask layer; and annealing said insulating material at a temperature of at least 1,150° C.

2. A method according to claim 1 wherein said annealing step is performed for a period of time of about 0.5 hours to about 8 hours.

3. A method according to claim 1 wherein said annealing step is performed for a period of time of about 1 hour.

4. A method according to claim 1 wherein said annealing step is performed in an inert atmosphere.

5. A method according to claim 1 wherein said annealing step is performed in an atmosphere of nitrogen ($N_2$).

6. A method according to claim 1 further comprising the step of planarizing said insulating material so that said mask layer is exposed.

7. A method according to claim 6 further comprising the step of removing a remaining portion of said mask layer so that said substrate is exposed.

8. A method according to claim 6 wherein said planarizing step comprises using a chemical-mechanical polish.

9. A method according to claim 1 wherein said step of forming said mask layer comprises the steps of forming an oxide layer on said substrate and forming a nitride layer on said oxide layer.

10. A method according to claim 1 wherein said step of forming said layer of said insulating material comprises the steps of forming an oxide layer on inner walls of said trench, and depositing an insulating material on said oxide layer to fill said trench.

11. A method according to claim 10 wherein said step of depositing said insulating material comprises forming an oxide by chemical vapor deposition.

12. A method for forming a microelectronic structure, said method comprising the steps of:

forming a mask layer on a substrate wherein said mask layer exposes a portion of said substrate;

forming a trench in said exposed portion of said substrate;

forming a layer of an insulating material which fills said trench and covers said mask layer; and annealing said insulating material at a temperature in the range of about 1,000° C. to about 1,400° C. for a period of time of about 0.5 hours to about 8 hours wherein said step of annealing said insulating material at a temperature in the range of 1,000° C. to about 1,400° C. comprises annealing said insulating material at a temperature of at least 1,150° C.

13. A method according to claim 12 further comprising the step of planarizing said insulating material so that said mask layer is exposed.

14. A method according to claim 13 further comprising the step of removing a remaining portion of said mask layer so that said substrate is exposed.

15. A method according to claim 12 wherein said annealing step is performed for a period of time of about 1 hour.

16. A method according to claim 12 wherein said annealing step is performed in an inert atmosphere.

17. A method according to claim 16 wherein said annealing step is performed in an atmosphere of nitrogen ($N_2$).

18. A method according to claim 13 wherein said planarizing step comprises using a chemical-mechanical polish.

19. A method according to claim 12 wherein said step of forming said mask layer comprises the steps of forming an oxide layer on said substrate and forming a nitride layer on said oxide layer.

20. A method according to claim 12 wherein said step of forming said layer of said insulating material comprises the steps of forming an oxide layer on inner walls of said trench, and depositing an insulating material on said oxide layer to fill said trench.

21. A method according to claim 20 wherein said step of depositing said insulating material comprises forming an oxide by chemical vapor deposition.

22. A method according to claim 1 wherein said mask layer comprises an oxide buffer layer on a nitride layer opposite said substrate, and wherein said step of forming said layer of said insulating material is preceded by the step of removing said oxide buffer layer.

23. A method according to claim 19 wherein said mask layer is an oxide buffer layer on a nitride layer opposite said substrate, and wherein said step of forming said layer of said insulating material is preceded by the step of removing said oxide buffer layer.

* * * * *